United States Patent
Chen et al.

(10) Patent No.: US 6,753,249 B1
(45) Date of Patent: Jun. 22, 2004

(54) MULTILAYER INTERFACE IN COPPER CMP FOR LOW K DIELECTRIC

(75) Inventors: Ying-Ho Chen, Taipei (TW); Jih-Churng Twu, Chung-Ho (TW); Weng Chang, Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 725 days.

(21) Appl. No.: 09/759,908

(22) Filed: Jan. 16, 2001

(51) Int. Cl.$^7$ .................................... H01L 21/4763
(52) U.S. Cl. ................. 438/637; 438/636; 438/638; 438/645; 438/680; 438/687; 438/691
(58) Field of Search ................. 438/633, 631, 438/636, 637, 638, 641, 645, 680, 687, 691

(56) References Cited

U.S. PATENT DOCUMENTS

| | | | | |
|---|---|---|---|---|
| 6,156,149 A | * | 12/2000 | Cheung et al. | 156/272.2 |
| 6,228,760 B1 | * | 5/2001 | Yu et al. | 438/636 |
| 6,458,689 B2 | * | 10/2002 | Yu et al. | 438/631 |
| 6,620,745 B2 | * | 9/2003 | Jang et al. | 438/787 |
| 6,638,853 B1 | * | 10/2003 | Sue et al. | 438/633 |

* cited by examiner

*Primary Examiner*—David Nelms
*Assistant Examiner*—Renee R. Berry
(74) *Attorney, Agent, or Firm*—George O. Saile; Stephen B. Ackerman

(57) ABSTRACT

An improved and new process, used for the elimination of copper line damage, copper defects, non-uniformity improvement, with low dishing and erosion, in damascene processing, is disclosed. This invention relates to a method of fabrication used for semiconductor integrated circuit devices, and more specifically to the elimination of copper line damage for damascene processing, by depositing a multilayer interface material, consisting of a mechanically hard film and a soft film, over a low dielectric constant, interlevel metal dielectric (IMD), and subsequently chemical mechanical polishing (CMP) back the excess material to planarize the surface.

57 Claims, 4 Drawing Sheets

COMPARISON OF SOFT AND HARD INTERFACE LAYER FOR low-k DAMASCENE Cu CMP

| DAMASCENE FILM STACK | DISH/RANGE(A) | EROSION/RANGE(A) | COMMENT |
|---|---|---|---|
| SILK 5kA/PEOX 1kA/SiON 600A | 311/199 | 499/321 | low k + SOFT FILM+DARC |
| SILK 5kA/PE-TEOS 1kA/SiON 600A | 211/232 | 236/343 | low k + SOFT FILM+DARC |
| SILK 5kA/SiN 1kA/SiON 600A | 749/591 | 645/543 | low k + HARD FILM+DARC |
| SILK 5kA/PEOX 500A+SiN500A/SiON 600A | 659/588 | 595/424 | low k + SOFT&HARD FILM+DARC |
| SILK 5kA/SiN500A+PEOX 500A/SiON 600A | 681/594 | 587/478 | low k + HARD&SOFT FILM+DARC |

*FIG. 7*

COMPARISON OF SOFT AND HARD INTERFACE LAYER FOR low-k DAMASCENE Cu CMP

| DAMASCENE FILM STACK | Cu LINE DAMAGE/DEFECT | COMMENT |
|---|---|---|
| SILK 5kA/PEOX 1kA/SiON 600A | SOME DEFECT SPOTS | low k + SOFT FILM+DARC |
| SILK 5kA/PE-TEOS 1kA/SiON 600A | SOME DEFECT SPOTS | low k + SOFT FILM+DARC |
| SILK 5kA/SiN 1kA/SiON 600A | NO DAMAGE AND DEFECT | low k + HARD FILM+DARC |
| SILK 5kA/PEOX 500A+SiN500A/SiON 600A | NO DAMAGE AND DEFECT | low k + SOFT&HARD FILM+DARC |
| SILK 5kA/SiN500A+PEOX 500A/SiON 600A | NO DAMAGE AND DEFECT | low k + HARD&SOFT FILM+DARC |

*FIG. 8*

MULTILAYER INTERFACE IN COPPER CMP FOR LOW K DIELECTRIC

BACKGROUND OF THE INVENTION (1) Field of the Invention

This invention relates to a method of fabrication used for semiconductor integrated circuit devices, and more specifically to the elimination of copper line damage for damascene processing, by depositing a multilayer interface material, consisting of a mechanically hard film and a soft film, over a low dielectric constant, interlevel metal dielectric (IMD), and subsequently chemical mechanical polishing (CMP) back the excess material to planarize the surface.

(2) Description of Related Art

As an introduction and background to Prior Art, the conventional dual damascene process scheme is commonly used to fabricate of copper interconnects, trench, and contact vias. Dual Damascene wiring interconnects (and/or studs) are formed by depositing one or two dielectric layers on a planar surface, patterning it using photolithography and dielectric reactive ion etch (RIE), then filling the recesses with conductive copper metal. The excess metal is removed by chemical mechanical polishing (CMP), while the troughs or channels remain filled with inlaid metal. With the dual damascene process, two layers of metal are formed as one, i.e., wiring line and contact stud vias, avoiding an interface between the layers.

Related Prior Art background patents will now be described in this section.

U.S. Pat. No. 6,004,188 entitled "Method for Forming Copper Damascene Structures by Using a Dual CMP Barrier Layer" granted Dec. 21, 1999 to Roy describes a method for forming copper damascene structures by using a dual chemical mechanical polish (CMP) barrier layer. The polishing barrier layers consist of a bottom layer of TiN with a layer of Ta or TaN on top of the TiN layer. The top layer has a low polishing rate, while the bottom layer has a high polishing rate similar to that of copper. Dishing of copper lines and interconnects is avoided by this method.

U.S. Pat. No. 6,010,962 entitled "Copper Chemical Mechanical Polishing (CMP) Dishing" granted Jan. 4, 2000 to Lui et al. shows Chemical-Mechanical Polish (CMP) planarizing method that avoids dishing. A conformal blanket barrier layer is formed over the substrate including the already formed trench/via regions. A copper seed layer is grown over the barrier layer. A layer of photoresist is deposited over the substrate filling the composite structure. These layers are then chemical mechanical polished (CMP) back to planarize the surface leaving both the seed layer and barrier layer on the walls of the trench/via. The photoresist is removed and is replaced by electroless plated copper, which forms a "dome-like" structures that prevents dishing.

U.S. Pat. No. 5,512,163 entitled "Method for Forming a Planarization Etch Stop" granted Apr. 30, 1996 to Warfield shows mechanical polishing method that uses an etch-stop layer consisting of a metal and grit material, i.e., diamond powder, over a conductive layer.

U.S. Pat. No. 5,854,133 entitled "Method for Manufacturing a Semiconductor Device" granted Dec. 29, 1998 to Hachiya et al. shows chemical mechanical polish (CMP) planarizing method that utilizes a polysilicon film as an etch-stop. A carbon film is also used an etch-stop, in conjunction with an insulation film, which is planarized on a silicon substrate.

SUMMARY OF THE INVENTION

It is a general object of the present invention to provide an improved method of forming an integrated circuit in which copper line damage is eliminated for damascene processing, by depositing a multilayer interface material, consisting of a mechanically hard film and a soft film, over a low dielectric constant, interlevel metal dielectric (IMD), and subsequently chemical mechanical polishing (CMP) back the excess material to planarize the surface. An outline of the key process steps of this invention follow.

Low dielectric constant material is deposited, as an intermetal dielectric (IMD) layer, over the substrate, to subsequently form dual damascene trench/via openings. The low dielectric constant material, as an intermetal dielectric layer (IMD) or layers, and in general, the insulating layers, are selected from the group comprised of "SILK C. H.O. (polymer based)", Flare and other low-k polymer materials, silicon dioxide or silicon oxide, and/or silicon nitride. The key multilayer interface layer is deposited over the intermetal dielectric layer, comprised of a bottom hard film layer, which is selected from the group comprised of silicon nitride, silicon oxynitride, and silicon carbide. Next, the second part of multilayer interface layer is deposited. This second part of the multilayer interface layer is comprised of a top soft film layer, which is selected from the group comprised of silicon oxide, plasma enhanced (PE) oxide, plasma enhanced (PE) TEOS, tetraethylorthosilicate, and low dielectric constant polymer materials. Hence, the multilayer interface layer is comprised of a bottom hard film layer and a top soft film layer. However, the reversal of these layers, namely a soft layer first, bottom layer, and a hard layer second, top layer, is just as effect. Next, a dielectric anti-reflective coating (DARC) is place over the multilayer interface layer and this DARC layer is selected from the group comprised of silicon oxynitride, and is deposited by chemical vapor deposition (CVD), over the multilayer interface layer. A layer of photoresist is patterned over the DARC and multilayer interface layer.

Next, the excess copper and the other top layer materials are planarized forming in the damascene and dual damascene patterned openings, inlaid copper metal, by removing excess conducting material to form inlaid dual damascene conducting metal interconnects, in trench and via openings, by chemical mechanical polishing (CMP) the inlaid copper metal layer, by removing the excess copper metal layers including excess copper seed layer, the excess barrier layer, and the excess multilevel interface layer, including the dielectric anti-reflective coating (DARC). Thus the surface is planarized by chemical mechanical polishing (CMP), forming smooth surface inlaid copper, which remains in the open regions.

Note, the processes described in this invention are compatible with MOSFET CMOS processing, for CMOS devices and circuits, in both logic and memory applications. The hard film layer polishing properties, materials consisting of silicon nitride, silicon oxynitride and silicon carbide, have a slower polishing removal rate than that of copper. The soft film layer polishing properties, materials consisting of silicon oxide, plasma enhanced (PE) oxide, plasma enhanced (PE) TEOS, tetraethylorthosilicate and low dielectric constant polymer materials, have a faster polishing removal rate than that of copper.

Data is presented which shows a comparison of soft and hard interface layers, with multilayer interface layers for chemical mechanical polishing (CMP) of copper, presenting dishing, erosion and non-uniformity data. The main area highlighted for this present invention, contain the data for interface layers soft & hard, and hard & soft, upon a "SILK C.H.O. (polymer based)", low dielectric layer. The interface layers for these two bottom categories of plasmas enhanced oxide (PEOX) 500 Angstrom thick and silicon oxynitride (SION) 500 Angstroms thick, show low dishing and low erosion. Data is also presented that shows a comparison of soft and hard interface layers, with multilayer interface layers for chemical mechanical polishing (CMP) of copper, copper line damage and defect data. The main area highlighted for this present invention, is the data for interface layers soft & hard, and hard & soft, upon a "Silk C.H.O. (polymer based)", low dielectric layer. The interface layers for these two bottom categories of plasmas enhanced oxide (POX) 500 Angstrom thick and silicon oxynitride (SION) 500 Angstroms thick, show no copper line damage dishing and no defects.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 7, which is a comparison of soft and hard interface layers, with multilayer interface layers for chemical mechanical polishing (CMP) of copper, showing dishing, erosion and non-uniformity data.

FIG. 8, which is a comparison of soft and hard interface layers, with multilayer interface layers for chemical mechanical polishing (CMP) of copper, showing copper line damage and defect data.

DESCRIPTION OF THE PREFERRED EMBODIMENTS

The new and improved method of fabrication used for semiconductor integrated circuit devices, the elimination of copper line damage for damacene processing, by depositing a multilayer interface material, consisting of a mechanically hard film and a soft film, over a low dielectric constant, interlevel metal dielectric (IMD), and subsequently chemical mechanical polishing (CMP) back the excess material to planarize the surface.

Figure 1:
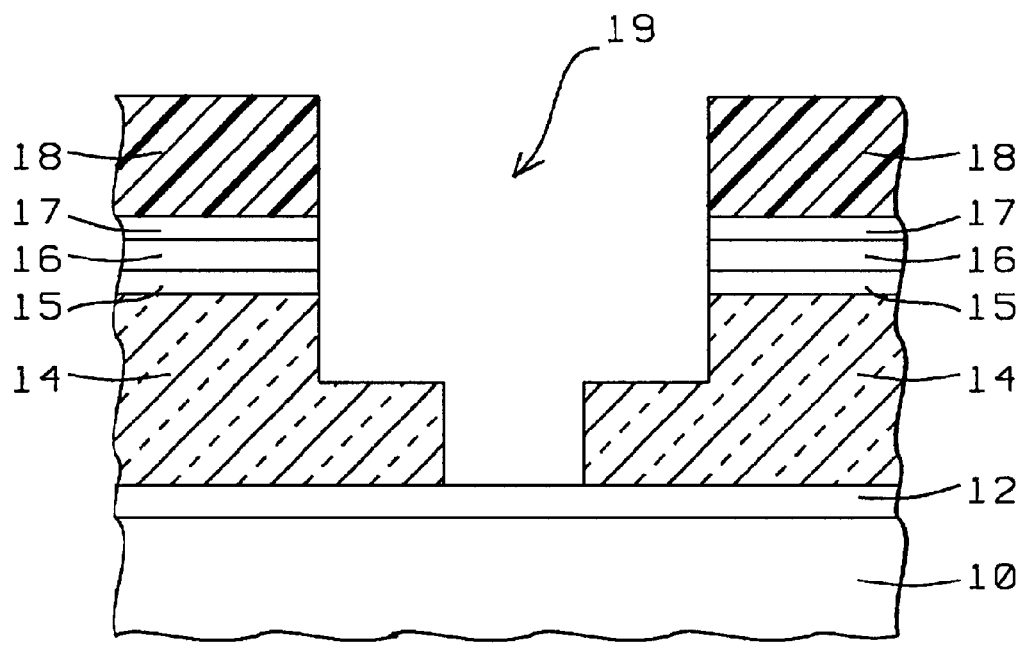
FIG. 1, which in cross-sectional representation, is sketched the first steps in this process, wherein a special multilayer interface layer (or chemical mechanical polishing (CMP) barrier or stop layer) and dual damascene trench/via insulator openings are patterned together.

Referring to FIG. 1, which in cross-sectional representation, is sketched the first steps in this process, wherein a special multilayer interface layer (or chemical mechanical polishing (CMP) barrier or stop layer) and dual damascene trench/via insulator openings are patterned together. FIG. 1 illustrates the layers used in the CMP dual damascene process. Provided is a substrate 10, a semiconductor substrate. An insulating layer 12 is provided over the substrate 10. A low dielectric constant material is deposited, as an intermetal dielectric (IMD) layer 14, over the substrate. The low dielectric constant material, as an intermetal dielectric layer (IMD) or layers 14, and in general, the insulating layers, are selected from the group comprised of "Silk C.H.O. (polymer based)", Flare, low-k polymer, silicon dioxide or silicon oxide, and/or silicon nitride, deposited by chemical vapor deposition (CVD), in the thickness range from approximately 1,000 to 5,000 Angstroms. Next, a multilayer interface layer 15, 16 is deposited over the intermetal dielectric layer 14, comprised of a bottom hard film layer 15, which is selected from the group comprised of silicon nitride, silicon oxynitride, and silicon carbide deposited by chemical vapor deposition (CVD), in the thickness range from approximately 100 to 500 Angstroms. Next, the second part of multilayer interface layer, 15, 16 is deposited. This second part of the multilayer interface layer is comprised of a top soft film layer, which is selected from the group comprised of silicon oxide, plasma enhanced (PE) oxide, plasma enhanced (PE) TEOS, tetraethylorthosilicate, low dielectric constant materials, in the thickness range from approximately 100 to 500 Angstroms. Hence, the multilayer interface layer 15, 16 is comprised of a bottom hard film layer 15 and a top soft film layer 16. However, the reversal of these layers, namely a soft layer first, bottom layer, and a hard layer second, top layer, is just as effect. Next, a dielectric anti-reflective coating (DARC) 17 is place over the multilayer interface layer and this DARC layer is selected from the group comprised of silicon oxynitride, and is deposited by chemical vapor deposition (CVD), over the multilayer interface layer, in the thickness range from approximately 300 to 600 Angstroms. A layer of photoresist 18 is patterned over the DARC 18 and multilayer interface layer 15, 16.

Referring again to FIG. 1, in cross-section is sketched the patterning and forming of the dual damascene pattern, namely the trench/via openings 19. The is performed by standard trench/via patterning and etching. Note, the multilevel interface layer 15, 16 and the DARC layer 17 are also patterned and etched, at the same time, that the intermetal dielectric layer 14 is patterned and etched.

Figure 2:
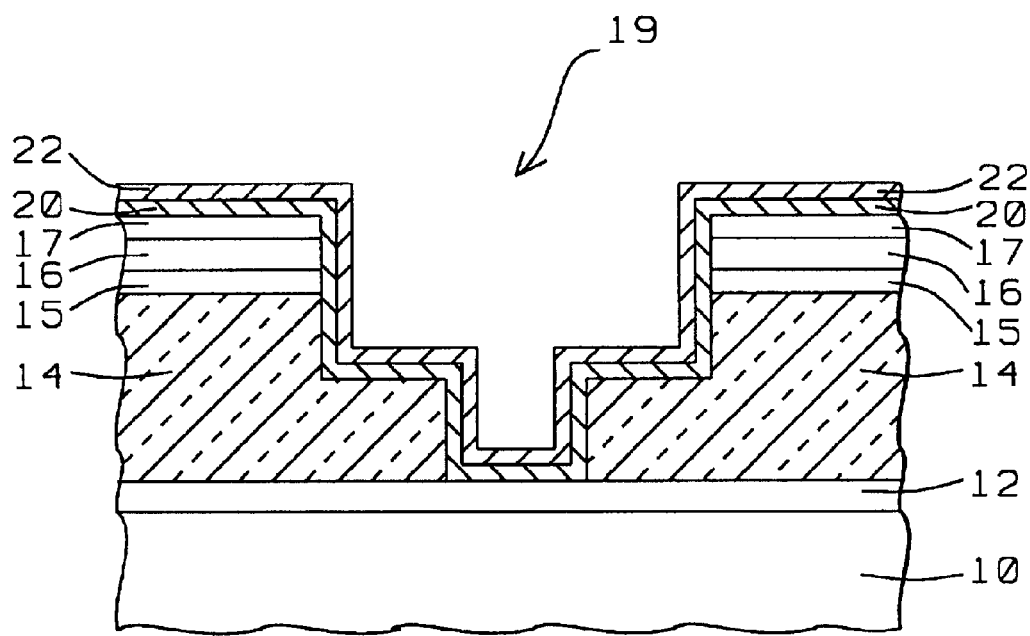
FIG. 2, which illustrated in cross-sectional drawing, is sketched the blanket deposition of a metal diffusion barrier and blanket deposition of the copper seed layer.

Referring to FIG. 2, in cross-section is sketched the next processing steps, the deposition of a trench/via liner 20, which is a metal diffusion barrier 20, over the trench/via openings and over the DARC layer 17, after a photoresist strip. The diffusion barrier liner or diffusion barrier layer 20, which also aids adhesion, deposited by sputtering (PVD), and the liner barrier material is selected from the group comprised of Ta, TaN and, in a thickness range from about 100 to 4,000 Angstroms. Next, a copper seed layer liner 22, for interconnects and contact vias, deposited over the barrier layer 20, by sputtering (PVD), and the seed type materials are comprised of a thin Cu layer, thickness from about 1,000 to 10,000 Angstroms.

A brief summary of the copper seed layer with process details follows: the copper seed layer is deposited by IMP, ion mass plasma, plus the addition of ECD, electrical plating of copper. The total copper seed layer thickness range is between approximately 1,000 to 2,000 Angstrom thick.

Figure 3:
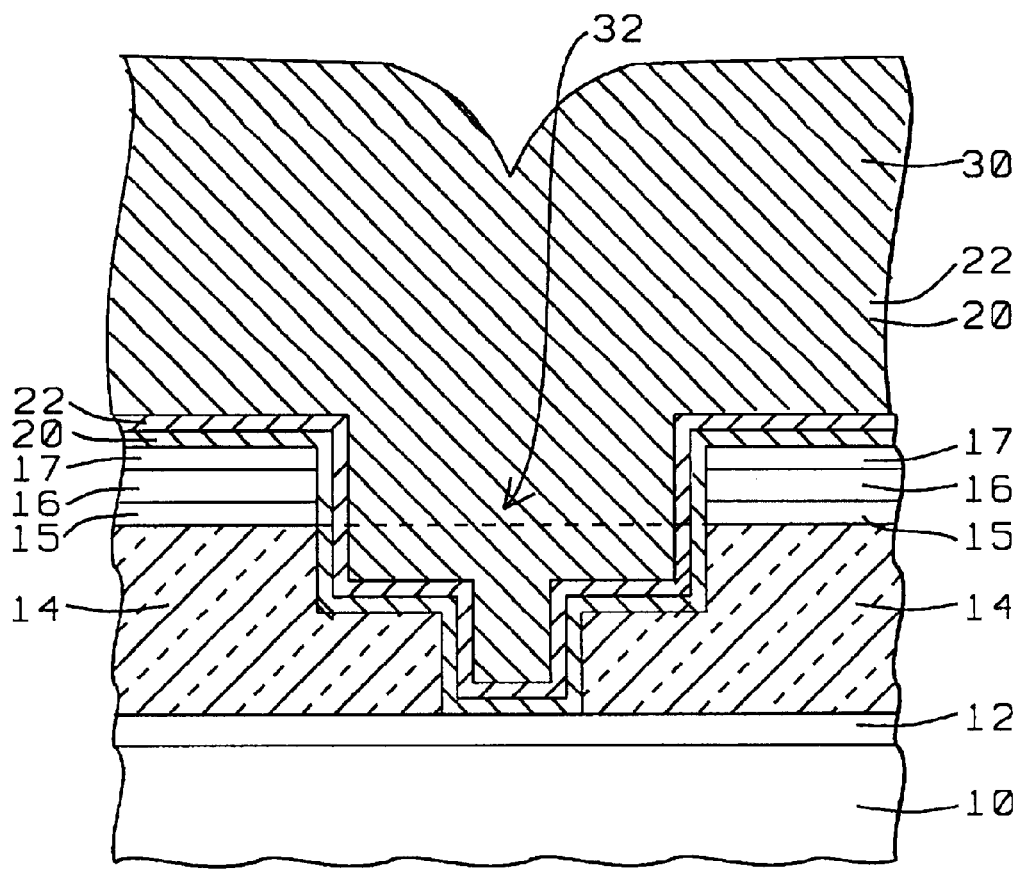
FIG. 3, which illustrated in cross-sectional drawing, is the blanket deposition of an electrochemical deposited (ECD) copper layer upon the seed layer.

Referring to FIG. 3, in cross-section is sketch the next processing step, the deposition of a thick layer of copper 30, over the copper seed layer 22. The dotted line (32) outlines the subsequent chemical mechanical polish (CMP) back of the excess copper metal. The copper metal layer 30 is selected from the group comprised of Cu, AlCu alloys and AlCuSi alloys. The damascene openings are filled with the layer of copper 30, inlaid conducting material layer, to form conducting interconnect lines and contact vias for interconnects and contact vias, and is consists of copper deposited by an electrochemical deposition (ECD), the Cu approximate thickness from 4,000 to 10,000 Angstroms.

Figure 4:
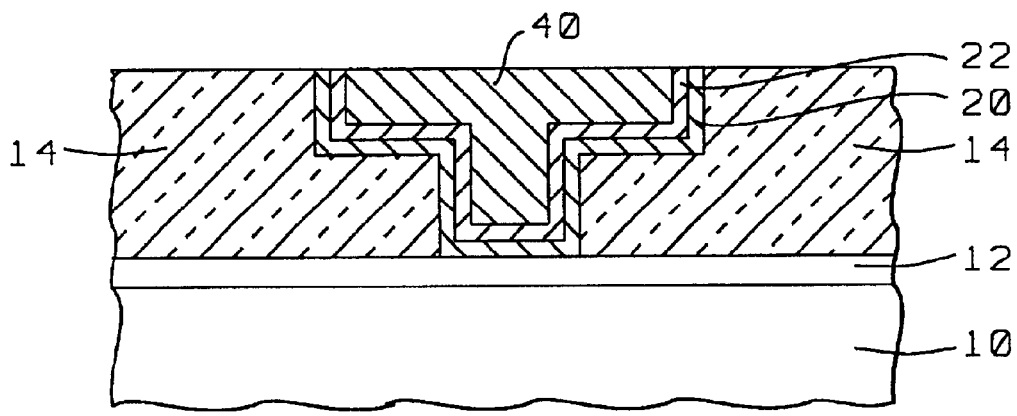
FIG. 4, which illustrated in cross-sectional drawing, the final steps of the invention, planarization of the surface by chemical mechanical polishing (CMP) back of the excess copper metal, the excess copper seed layer, the excess metal diffusion barrier layer, and the special multilayer interface layer.

FIG. 4, which illustrated in cross-sectional drawing, the final steps of the invention, planarization of the surface by chemical mechanical polishing (CMP) back of the excess copper metal, the excess copper seed layer, the excess metal diffusion barrier layer, and the special multilayer interface layer. With Reference to FIG. 4, illustrated in cross-sectional drawing, is sketched a continuation of the process embodiments of this invention. The excess copper and the other top layer materials are planarized forming in the damascene and dual damascene patterned openings, inlaid copper metal 40, by the following methods, selected from the group consisting of reactive ion etching (RIE), milling, ion milling, wet etching, or a combination thereof. The levels of conducting metal copper layers are planarized by removing excess conducting material to form inlaid dual damascene conducting metal interconnects 40, in trench and via openings, and this process includes planarization by the following methods, selected from the group consisting of planarization by chemical mechanical polish (CMP), milling, ion milling, and/or etching, or a combination thereof. Therefore, the final processing steps are the forming by damascene and chemical mechanical polishing (CMP) the inlaid copper metal layer 40, by removing the excess copper metal layers including excess seed layer 22, the excess barrier layer 20, and the multilevel interface layer 15, 16 including the dielectric anti-reflective coating (DARC) 17, thus planarizing the surface by chemical mechanical polishing (CMP), forming smooth surface inlaid copper, which remains in the open regions.

Note, the processes described in this invention are compatible with MOSFET CMOS processing, for CMOS devices and circuits, in both logic and memory applications. The hard film layer polishing properties, materials consisting of silicon nitride, silicon oxynitride and silicon carbide, have a slower polishing removal rate than that of copper. The soft film layer polishing properties, materials consisting of silicon oxide, plasma enhanced (PE) oxide, plasma enhanced (PE) TEOS, tetraethylorthosilicate, and low dielectric constant polymer materials, have a faster polishing removal rate than that of copper.

A brief summary of the chemical mechanical process details follows: a polyurethane polishing pad, spin speed 20 to ~50 rpm, slurry $Al_2O_3$ based, $H_2O_2$, DIW, temperature between approximately 25 to 35° C., hard layer removal about 200 Angstroms/min, soft layer removal about 600 Angstroms/min, copper layer about 400 Angstroms/min, with a polishing stop on low K dielectric material.

Figure 5:
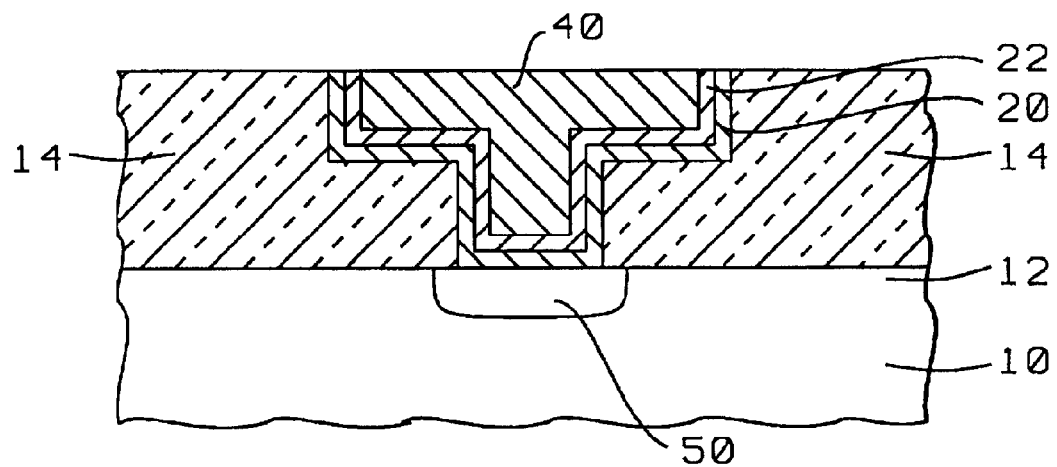
FIG. 5, which illustrated in cross-sectional drawing, is another embodiment of the present invention, contact to a diffusion region of a semiconductor substrate.
Figure 6:
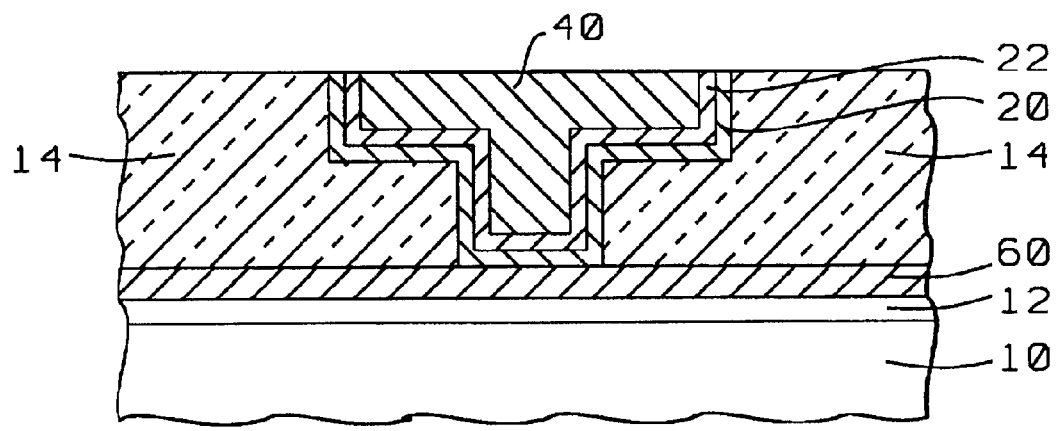
FIG. 6, which illustrated in cross-sectional drawing, is yet another embodiment of the present invention, contact to a multilevel metal line and wiring pattern, on a semiconductor substrate.

Some of the applications of the present invention are now presented. As noted earlier, the processes described in this invention are compatible with MOSPET CBMS processing, for CMDS devices and circuits, in both logic and memory applications, in which the substrate is semiconductor single crystal silicon. Referring to FIG. 5, illustrated in cross-sectional drawing, is another embodiment of the present invention, contact to a diffusion region 50 on a semiconductor substrate 10. Referring to FIG. 6, illustrated in cross-sectional drawing, is yet another embodiment of the present invention, contact to a multilevel metal line and wiring pattern 60, on an insulating layer 12, on a semiconductor substrate 10.

FIG. 7, which is a comparison of soft and hard interface layers, with multilayer interface layers for chemical mechanical polishing (CMP) of copper, showing dishing, erosion and non-uniformity data. The main area highlighted for this present invention, is the two low boxes that contain the data for interface layers soft & hard, and hard & soft, upon a "Silk C.E.O. (polymer based)", low dielectric layer. The Interface layers for these two bottom categories of plasmas enhanced oxide (POX) 500 Angstrom thick and silicon oxynitride (SION) 500 Angstroms thick, show low dishing and low erosion.

FIG. 8, which is a comparison of soft and hard interface layers, with multilayer interface layers for chemical mechanical polishing (CHP) of copper, showing copper line damage and defect data. The main area highlighted for this present invention, is the two low boxes that contain the data for interface layers soft & hard, and hard & soft, upon a "Silk C.H.O. (polymer based)", low dielectric layer. The interface layers for these two bottom categories of plasmas enhanced oxide (POX) 500 Angstrom thick and silicon oxynitride (SION) 500 Angstroms thick, show no copper line damage dishing and no defects.

While the invention has been particularly shown and described with reference to the preferred embodiments thereof, it will be understood by those skilled in the art that various changes in form and details may be made without departing from the spirit and scope of the invention.

What is claimed is:

1. A method of using dual damascene comprising:
   providing a substrate having an insulator layer deposited thereon;
   depositing a low dielectric constant material, as an intermetal dielectric (IMD) layer, over said substrate;
   depositing a multilayer interface layer over the intermetal dielectric layer (IMD) comprised of a bottom hard film layer and a top soft film layer;
   depositing a dielectric anti-reflective coating (DARC) over the multilayer interface layer;
   patterning and forming dual damascene trench/via openings in said intermetal dielectric (IMD) layer, along with the exposed dielectric anti-reflective coating (DARC) and the exposed multilayer interface;
   removing the patterning and masking material;
   depositing a metal diffusion barrier layer and a copper seed layer into the dual damascene trench/via openings of the intermetal dielectric (IMD) layer and over said substrate and over the dielectric anti-reflective coating (DARC);
   depositing a copper metal layer over said copper seed layer, filling the dual damascene trench/via;
   polishing off the excess materials, thereby planarizing the surface to form conductive interconnects and contacts to the underlying substrate.

2. The method of claim 1, wherein said low dielectric constant material, as an intermetal dielectric layer (IMD) or layers, and in general, the insulating layers, are selected from the group consisting of "Silk C.H.O. (polymer based)", FLARE or low-K polymer, silicon dioxide or silicon oxide, and/or silicon nitride, deposited by chemical vapor deposition (CVD), in the thickness range from approximately 1,000 to 5,000 Angstroms.

3. The method of claim 1, wherein said multilayer interface layer comprised of said bottom hard film layer is selected from the group consisting of silicon nitride, silicon oxynitride, silicon carbide, deposited by chemical vapor deposition (CVD), in the thickness range from approximately 100 to 500 Angstroms.

4. The method of claim 1, wherein said multilayer interface layer comprised of said top soft film layer is selected from the group consisting of silicon oxide, plasma enhanced (PE) oxide, plasma enhanced (PE) TEOS, tetraethylorthosilicate, low dielectric constant materials, FLARE or polymer in the thickness range from approximately 100 to 500 Angstroms.

5. The method of claim 1, wherein said multilayer interface layer is comprised of a bottom hard film layer and a top soft film layer.

6. The method of claim 1, wherein said multilayer interface layer is comprised of a bottom soft film layer and a top hard film layer.

7. The method of claim 1, wherein said dielectric anti-reflective coating (DARC) is selected from the group consisting of silicon oxynitride, silicon carbide, and is deposited by chemical vapor deposition (CVD), over said multilayer interface layer, in the thickness range from approximately 300 to 600 Angstroms.

8. The method of claim 1, wherein the hard film layer polishing properties, selected from the group consisting of silicon nitride, silicon oxynitride, silicon carbide, have a slower polishing removal rate than that of copper.

9. The method of claim 1, wherein the soft film layer polishing properties, selected from the group consisting of silicon oxide, plasma enhanced (PE) oxide, plasma enhanced (PE) TEOS, tetraethylorthosilicate, low dielectric constant materials, FLARE or polymer, have a faster polishing removal rate than that of copper.

10. The method of claim 1, wherein the multilevel interface layer polishing properties comprised of both a hard layer selected from the group consisting of silicon nitride, silicon oxynitride, and a soft layer selected from the group consisting of silicon oxide, plasma enhanced (PE) oxide, plasma enhanced (PE) TEOS, tetraethylorthosilicate, low dielectric constant materials, FLARE or low-K polymer, act in combination during polishing to form planarized copper.

11. The method of claim 1, wherein the trenches or channels for metal interconnects and via hole contact openings contain a barrier, diffusion barrier liner or diffusion barrier layer, which also aids adhesion, deposited by sputtering (PVD), liner barrier material selected from the group consisting of Ta, TaN and, in a thickness range from about 100 to 4,000 Angstroms.

12. The method of claim 1, wherein the damascene trench or channel interconnects and via hole contacts can be comprised of a copper seed layer liner, for interconnects and contact vias, deposited by sputtering (PVD), seed type materials comprising of thin Cu, thickness from about 1,000 to 10,000 Angstroms.

13. The method of claim 1, wherein said copper metal layer is selected from the group consisting of Cu, AlCu alloys and AlCuSi alloys.

14. The method of claim 1, wherein the damascene openings is filled with a layer of copper, inlaid conducting material layer, forming conducting interconnect lines and contact vias for interconnects and contact vias, and is comprised of copper deposited by an electrochemical deposition (ECD), the Cu approximate thickness from 4,000 to 10,000 Angstroms.

15. The method of claim 1, wherein damascene and dual damascene patterned openings, for subsequent inlaid metal, are formed by the following methods, selected from the group consisting of reactive ion etching (RIE), milling, ion milling, wet etching, or a combination thereof.

16. The method of claim 1, wherein the levels of conducting metal copper layers are planarized by removing excess conducting material to form inlaid dual damascene conducting metal interconnects, in trench and via openings, and this process includes planarization by the following methods, selected from the group consisting of planarization by chemical mechanical polish (CMP), milling, ion milling, and/or etching, or a combination thereof.

17. The method of claim 1, wherein one of the final processing steps is the forming by damascene and chemical mechanical polishing (CMP) the inlaid copper metal layer, by removing the excess copper metal layers, the excess barrier layer, and the multilevel interface layer including the dielectric anti-reflective coating (DARC), thus planarizing the surface by chemical mechanical polishing (CMP), forming smooth surface inlaid copper, which remains in the open regions.

18. A method of using dual damascene technique to a conductive interconnect wiring and contact via to a semiconductor diffusion in the fabrication of MOSFET devices comprising:
   providing a semiconductor substrate having a semiconductor diffusion region therein;
   depositing a low dielectric constant material, as an intermetal dielectric (IMD) layer, over said semiconductor substrate and the semiconductor diffusion region;
   depositing a multilayer interface layer over the intermetal dielectric layer (IMD) comprised of a bottom hard film layer and a top soft film layer;
   depositing a dielectric anti-reflective coating (DARC) over the multilayer interface layer;
   patterning and etching dual damascene trench/via openings in said intermetal dielectric (IMD) layer, along with the exposed dielectric anti-reflective coating (DARC) and the exposed multilayer interface layer;
   removing the patterning and masking material;
   depositing a metal diffusion barrier layer and a copper seed layer into the dual damascene trench/via openings of the intermetal dielectric (IMD) layer and over said semiconductor diffusion region and over the dielectric anti-reflective coating (DARC);
   depositing a copper metal layer by electrochemical deposition (ECD) over said copper seed layer, filling the dual damascene trench/via openings;
   polishing off the excess copper metal, the dielectric anti-reflective coating (DARC) layer, the multilayer interface layer, the excess copper seed layer and the excess barrier layer outside of the trench/via openings, thereby planarizing the surface to form a conductive interconnect wiring and contact via to the underlying semiconductor diffusion region.

19. The method of claim 18, wherein said contact is made to a semiconductor diffusion region on a semiconductor substrate.

20. The method of claim 18, wherein the dual damascene process is compatible with MOSFET CMOS processing, devices and circuits, for both logic and memory applications.

21. The method of claim 18, wherein said low dielectric constant material, as an intermetal dielectric layer (IMD) or layers, and in general, the insulating layers, are selected from the group consisting of "Silk C.H.O. (polymer based)", FLARE or polymer, silicon dioxide or silicon oxide, and/or silicon nitride, deposited by chemical vapor deposition (CVD), in the thickness range from approximately 1,000 to 5,000 Angstroms.

22. The method of claim 18, wherein said multilayer interface layer comprised of said bottom hard film layer is selected from the group consisting of silicon nitride, silicon oxynitride, silicon carbide, deposited by chemical vapor deposition (CVD), in the thickness range from approximately 100 to 500 Angstroms.

23. The method of claim 18, wherein said multilayer interface layer comprised of said top soft film layer is selected from the group consisting of silicon oxide, plasma enhanced (PE) oxide, plasma enhanced (PE) TEOS, tetraethylorthosilicate, low dielectric constant polymer materials, in the thickness range from approximately 100 to 500 Angstroms.

24. The method of claim 18, wherein said multilayer interface layer is comprised of a bottom hard film layer and a top soft film layer.

25. The method of claim 18, wherein said multilayer interface layer is comprised of a bottom soft film layer and a top hard film layer.

26. The method of claim 18, wherein said dielectric anti-reflective coating (DARC) is selected from the group consisting of silicon oxynitride, and is deposited by chemical vapor deposition (CVD), over said multilayer interface layer, in the thickness range from approximately 300 to 600 Angstroms.

27. The method of claim 18, wherein the hard film layer polishing properties, selected from the group consisting of silicon nitride, silicon oxynitride, silicon carbide, have a slower polishing removal rate than that of copper.

28. The method of claim 18, wherein the soft film layer polishing properties, selected from the group consisting of silicon oxide, plasma enhanced (PE) oxide, plasma enhanced (PE) TEOS, tetraethylorthosilicate, low dielectric constant polymer materials, have a faster polishing removal rate than that of copper.

29. The method of claim 18, wherein the multilevel interface layer polishing properties comprised of both a hard layer selected from the group consisting of silicon nitride, silicon oxynitride, silicon carbide and a soft layer selected from the group consisting of silicon oxide, plasma enhanced (PE) oxide, plasma enhanced (PE) TEOS, tetraethylorthosilicate, low dielectric constant polymer materials, act in combination during polishing to form planarized copper.

30. The method of claim 18, wherein the trenches or channels for metal interconnects and via hole contact openings contain a barrier, diffusion barrier liner or diffusion barrier layer, which also aids adhesion, deposited by sputtering (PVD), liner barrier material selected from the group consisting of Ta, TaN and, in a thickness range from about 100 to 4,000 Angstroms.

31. The method of claim 18, wherein the damascene trench or channel interconnects and via hole contacts can be comprised of a copper seed layer liner, for interconnects and contact vias, deposited by sputtering (PVD), seed type materials comprising of thin Cu, thickness from about 1,000 to 10,000 Angstroms.

32. The method of claim 18, wherein the conductor wiring or conducting material consists of the following and is selected from the group consisting of Cu, AlCu alloys, and AlCusi alloys.

33. The method of claim 18, wherein said copper metal layer is selected from the group consisting of Cu, AlCu alloys and AlCuSi alloys.

34. The method of claim 18, wherein the damascene openings is filled with a layer of copper, inlaid conducting material layer, forming conducting interconnect lines and contact vias for interconnects and contact vias, and is comprised of copper deposited by an electrochemical deposition (ECD), the Cu approximate thickness from 4,000 to 10,000 Angstroms.

35. The method of claim 18, wherein damascene and dual damascene patterned openings, for subsequent inlaid metal, are formed by the following methods, selected from the group consisting of reactive ion etching (RIE), milling, ion milling, wet etching, or a combination thereof.

36. The method of claim 18, wherein the levels of conducting metal copper layers are planarized by removing excess conducting material to form inlaid dual damascene conducting metal interconnects, in trench and via openings, and this process includes planarization by the following methods, selected from the group consisting of planarization by chemical mechanical polish (CMP), milling, ion milling, and/or etching, or a combination thereof.

37. The method of claim 18, wherein one of the final processing steps is the forming by damascene and chemical mechanical polishing (CMP) the inlaid copper metal layer, by removing the excess copper metal layers, the excess barrier layer, and the multilevel interface layer including the dielectric anti-reflective coating (DARC), thus planarizing the surface by chemical mechanical polishing (CMP), forming smooth surface inlaid copper, which remains in the open regions.

38. A method of using dual damascene technique to form a conductive interconnect wiring and contact via to first level conductor wiring comprising:

providing a substrate having a layer of dielectric;

providing a first level conductor wiring surrounded by barrier material within the said layer of dielectric;

depositing a low dielectric constant material, as an intermetal dielectric (IMD) layer, over said first level conductor wiring;

depositing a multilayer interface layer over the intermetal dielectric layer (IMD) comprised of a bottom hard film layer and a top soft film layer;

depositing a dielectric anti-reflective coating (DARC) over the multilayer interface layer;

patterning and etching dual damascene trench/via openings in said intermetal dielectric (IMD) layer, along with the exposed dielectric anti-reflective coating (DARC) and the exposed multilayer interface layer;

removing the patterning and masking material;

depositing a metal diffusion barrier layer and a copper seed layer into the dual damascene trench/via openings of the intermetal dielectric (IMD) layer and over said first level of conductor wiring and over the dielectric anti-reflective coating (DARC);

depositing a copper metal layer by electrochemical deposition (ECD) over said copper seed layer, filling the dual damascene trench/via openings;

polishing off the excess copper metal, the dielectric anti-reflective coating (DARC) layer, the multilayer interface layer, the excess copper seed layer and the excess barrier layer outside of the trench/via openings, thereby planarizing the surface to form inlaid copper interconnect wiring and contact vias to first level conductor wiring.

39. The method of claim 38, wherein said substrate is semiconductor substrate or an IC module.

40. The method of claim 38, wherein the dual damascene process is compatible with MOSFET CMOS processing, devices and circuits, for both logic and memory applications.

41. The method of claim 38, wherein said low dielectric constant material, as an intermetal dielectric layer (IMD) or layers, and in general, the insulating layers, are selected from the group consisting of "Silk C.H.O. (polymer based)", low-k polymer materials, silicon dioxide or silicon oxide, and/or silicon nitride, deposited by chemical vapor deposition (CVD), in the thickness range from approximately 1,000 to 5,000 Angstroms.

42. The method of claim 38, wherein said multilayer interface layer comprised of said bottom hard film layer is selected from the group consisting of silicon nitride, silicon oxynitride, silicon carbide, deposited by chemical vapor deposition (CVD), in the thickness range from approximately 100 to 500 Angstroms.

43. The method of claim 38, wherein said multilayer interface layer comprised of said top soft film layer is selected from the group consisting of silicon oxide, plasma enhanced (PE) oxide, plasma enhanced (PE) TEOS, tetraethylorthosilicate, low dielectric constant polymer materials, in the thickness range from approximately 100 to 500 Angstroms.

44. The method of claim 38, wherein said multilayer interface layer is comprised of a bottom hard film layer and a top soft film layer.

45. The method of claim 38, wherein said multilayer interface layer is comprised of a bottom soft film layer and a top hard film layer.

46. The method of claim 38, wherein said dielectric anti-reflective coating (DARC) is selected from the group consisting of silicon oxynitride, and is deposited by chemical vapor deposition (CVD), over said multilayer interface layer, in the thickness range from approximately 300 to 600 Angstroms.

47. The method of claim 38, wherein the hard film layer polishing properties, selected from the group consisting of silicon nitride, silicon oxynitride, silicon carbide, have a slower polishing removal rate than that of copper.

48. The method of claim 38, wherein the soft film layer polishing properties, selected from the group consisting of silicon oxide, plasma enhanced (PE) oxide, plasma enhanced (PE) TEOS, tetraethylorthosilicate, low dielectric constant polymer materials, have a faster polishing removal rate than that of copper.

49. The method of claim 38, wherein the multilevel interface layer polishing properties comprised of both a hard layer selected from the group consisting of silicon nitride, silicon oxynitride, silicon carbide, and a soft layer selected from the group consisting of silicon oxide, plasma enhanced (PE) oxide, plasma enhanced (PE) TEOS, tetraethylorthosilicate, low dielectric constant polymer materials, act in combination during polishing to form planarized copper.

50. The method of claim 38, wherein the trenches or channels for metal interconnects and via hole contact openings contain a barrier, diffusion barrier liner or diffusion barrier layer, which also aids adhesion, deposited by sputtering (PVD), liner barrier material selected from the group consisting of Ta, TaN and, in a thickness range from about 100 to 4,000 Angstroms.

51. The method of claim 38, wherein the damascene trench or channel interconnects and via hole contacts can be comprised of a copper seed layer liner, for interconnects and contact vias, deposited by sputtering (PVD), seed type materials comprising of thin Cu, thickness from about 1,000 to 10,000 Angstroms.

52. The method of claim 38, wherein said first level conductor wiring or conducting material consists of the following and is selected from the group consisting of Cu, AlCu alloys, AlCuSi alloys and W.

53. The method of claim 38, wherein said copper metal layer is selected from the group consisting of Cu, AlCu alloys and AlCuSi alloys.

54. The method of claim 38, wherein the damascene openings is filled with a layer of copper, inlaid conducting material layer, forming conducting interconnect lines and contact vias for interconnects and contact vias, and is comprised of copper deposited by an electrochemical deposition (ECD), the Cu approximate thickness from 4,000 to 10,000 Angstroms.

55. The method of claim 38, wherein damascene and dual damascene patterned openings, for subsequent inlaid metal, are formed by the following methods, selected from the group consisting of reactive ion etching (RIE), milling, ion milling, wet etching, or a combination thereof.

56. The method of claim 38, wherein the levels of conducting metal copper layers are planarized by removing excess conducting material to form inlaid dual damascene conducting metal interconnects, in trench and via openings, and this process includes planarization by the following methods, selected from the group consisting of planarization by chemical mechanical polish (CMP), milling, ion milling, and/or etching, or a combination thereof.

57. The method of claim 38, wherein one of the final processing steps is the forming by damascene and chemical mechanical polishing (CMP) the inlaid copper metal layer, by removing the excess copper metal layers, the excess barrier layer, and the multilevel interface layer including the dielectric anti-reflective coating (DARC), thus planarizing the surface by chemical mechanical polishing (CMP), forming smooth surface inlaid copper, which remains in the open regions.

* * * * *